(12) United States Patent
Cho et al.

(10) Patent No.: US 11,219,145 B2
(45) Date of Patent: Jan. 4, 2022

(54) SELF-WRAP ELECTROMAGNETIC WAVE SHIELD TUBE

(71) Applicant: LS CABLE & SYSTEM LTD., Anyang-si (KR)

(72) Inventors: Chang Eun Cho, Suwon-si (KR); Young Hoon Yang, Seoul (KR); Chang Suk Kim, Seoul (KR); Un Kyoo Park, Seoul (KR)

(73) Assignee: LS CABLE & SYSTEM LTD., Anyang-si (KR)

( * ) Notice: Subject to any disclaimer, the term of this patent is extended or adjusted under 35 U.S.C. 154(b) by 0 days.

(21) Appl. No.: 17/087,860

(22) Filed: Nov. 3, 2020

(65) Prior Publication Data

US 2021/0136962 A1 May 6, 2021

(51) Int. Cl.
*H05K 9/00* (2006.01)
(52) U.S. Cl.
CPC ................... *H05K 9/009* (2013.01)

(58) Field of Classification Search
CPC ....................................... H05K 9/009
See application file for complete search history.

(56) References Cited

U.S. PATENT DOCUMENTS

2014/0262476 A1* 9/2014 Laurent ............... H02G 3/0481
174/379
2018/0287357 A1* 10/2018 Knudson ............... H02G 15/18

FOREIGN PATENT DOCUMENTS

JP 2010-526218 A 7/2010
JP 2013-110053 A 6/2013

* cited by examiner

*Primary Examiner* — Hung V Ngo
(74) *Attorney, Agent, or Firm* — K&L Gates, LLP

(57) ABSTRACT

The present disclosure relates to a self-wrap electromagnetic wave shield tube and a braid member, which are capable of improving workability of cable connection or cable shielding work and minimizing weight and costs while securing sufficient electromagnetic wave shielding performance in an electrical component space of a vehicle.

19 Claims, 5 Drawing Sheets

SELF-WRAP ELECTROMAGNETIC WAVE SHIELD TUBE

CROSS-REFERENCE TO RELATED APPLICATIONS

Pursuant to 35 U.S.C. § 119(a), this application claims the benefit of earlier filing date and right of priority to Korean Application No. 10-2019-0139911, filed on Nov. 5, 2019 and Korean Application No. 10-2020-0134389 filed Oct. 16, 2020, each of which is herein expressly incorporated by reference in its entirety.

FIELD

The present disclosure relates to a self-wrap electromagnetic wave shield tube and a braid member. More specifically, the present disclosure relates to a self-wrap electromagnetic wave shield tube and a braid member, which are capable of improving workability of cable connection or cable shielding work and minimizing weight and costs while securing sufficient electromagnetic wave shielding performance in an electrical component space of a vehicle.

BACKGROUND

Due to various electronic control parts and devices employed to increase the convenience of vehicles, the convenience of users or passengers has been greatly improved but concerns about malfunctions and deterioration of electrical components inside vehicles and safety accidents due to electromagnetic waves emitted from electronic devices are greatly increasing. Accordingly, as there is a growing need to shield electromagnetic waves generated in electronic components inside vehicles and international regulations on electromagnetic interference are increasingly strengthened, many efforts are being made to cope therewith. A main purpose of electromagnetic interference (EMI) shielding is to maintain the inherent performance of a target object by reflecting or absorbing electromagnetic waves generated from the object.

In addition to the electrical components employed in vehicles, a large number of cables are used in the vehicle to connect the electrical components and the number of cables is gradually increasing due to the advancement of vehicle functions.

In general, a shielding layer may be added in a process of manufacturing a cable for shielding but should be added afterward to a cable including no shielding layer or a connection portion of the cable.

In general, a heat-shrinkable tube may be considered as a shielding means for shielding a cable but should be mounted in a non-shrinking state into one cable before connection of cables and moved to a part of the cable to be shielded and a heat shrinkage process is performed using fire or heat device to reduce an internal diameter after the connection of the cables.

A self-wrap tube of an open structure that is heat-shrunk in advance has been introduced. However, although the self-wrap tube can be mounted after connection of cables, the self-wrap tube is generally formed of a shrinkable resin material or carbon fiber material, thus making it difficult to sufficiently shield electromagnetic waves in an area to be shielded.

SUMMARY

The present disclosure is directed to providing a self-wrap electromagnetic wave shield tube and a braid member, which are capable of improving workability of cable connection or cable shielding work and minimizing weight and costs while securing sufficient electromagnetic wave shielding performance in an electrical component space of a vehicle.

To achieve these objects, the present disclosure provides a self-wrap electromagnetic wave shield tube comprising a braid member formed by braiding a plurality of wire bundles including metal wires formed of copper-clad aluminum (CCA) and a plurality of shrinkage members arranged perpendicular to the wire bundles and having a heat shrinkage property, wherein the wire bundles of the braid member are arranged in parallel in a longitudinal direction, the shrinkage members are arranged in a circumferential direction perpendicular to the longitudinal direction, and the braid member is thermally contracted into a cylindrical shape and comprises overlapping parts overlapping in the circumferential direction.

And a copper volume fraction of the metal wires of the CCA material, which constitute the wire bundles, may be in a range of 10 vol % to 25 vol %.

And a shielding factor may be 50 dB or more at a signal frequency of 1 MHz to 10 MHz.

And a resistance value (F1) for 1 mm width of the self-wrap electromagnetic wave shield tube in the circumferential direction may be less than 0.3Ω and is defined by the following equation:

$$F1 = (\text{number } N \text{ of CCA wire bundles} \times \text{number } n \text{ of wires of each CCA wire bundle} \times \text{resistivity } (\Omega m) \text{ of each CCA wire})/\text{width } W \text{ (mm) of braid member)}$$

And the self-wrap electromagnetic wave shield tube may have an inner diameter of 10 mm or less, and each of the wire bundles of the braid member may have a width of 0.3 mm to 1 mm.

And the metal wires of the wire bundles may have a diameter of 0.15 mm or less, and the wire bundles may comprise ten or less metal wires.

And an overlapping range of the overlapping parts in the circumferential direction may be a range of 20 to 50 degrees in a state of a cable is not inserted into the self-wrap electromagnetic wave shield tube.

And the metal wires of the CCA material may comprise: aluminum wires; and a copper clad layer surrounding outer sides of the aluminum wires.

And the aluminum wires may be formed of aluminum with a purity of 99% or more, and the copper clad layer may be formed of oxygen-free copper with a purity of 99.9% or more.

And the shrinkage members may comprise wires of a polyolefin-based resin material.

And an average number of shrinkage members per inch in the longitudinal direction of the self-wrap electromagnetic wave shield tube may be seventeen to forty one.

And a shielding factor may be 40 dB or more at a signal frequency of 100 MHz.

And the shrinkage members may have a diameter of 0.25 mm to 0.3 mm.

And a plurality of shrinkage members may be arranged adjacent to each other to form one contraction part, and a plurality of contraction parts may be arranged apart from each other in the longitudinal direction of the self-wrap electromagnetic wave shield tube.

And the plurality of shrinkage members of the contraction part may be arranged in parallel in a direction perpendicular to the longitudinal direction of the self-wrap electromagnetic wave shield tube.

And two shrinkage members may form one contraction part.

And the metal wires of the wire bundles may be arranged in a single layer.

And to achieve these objects, the present disclosure provides a braid member which is formed by braiding a plurality of wire bundles including metal wires formed of a copper clad aluminum (CCA) material and a plurality of shrinkage members arranged perpendicular to the wire bundles and having a heat shrinkage property.

And a copper volume fraction of the metal wires of the CCA material, which constitute the wire bundles, may be 10 vol % to 25 vol %, and the metal wires of the CCA material may comprise: aluminum wires; and a copper clad layer surrounding outer sides of the aluminum wires.

And an average number of shrinkage members per inch in a longitudinal direction of the wire bundles may be seventeen to forty one.

DETAILED DESCRIPTION

Hereinafter, exemplary embodiments of the present disclosure will be described in detail with reference to the accompanying drawings. The present disclosure is, however, not limited thereto and may be embodied in many different forms. Rather, the embodiments set forth herein are provided so that this disclosure will be thorough and complete, and fully convey the scope of the disclosure to those of ordinary skill in the art. Throughout the specification, the same reference numbers represent the same elements.

Figure 1:
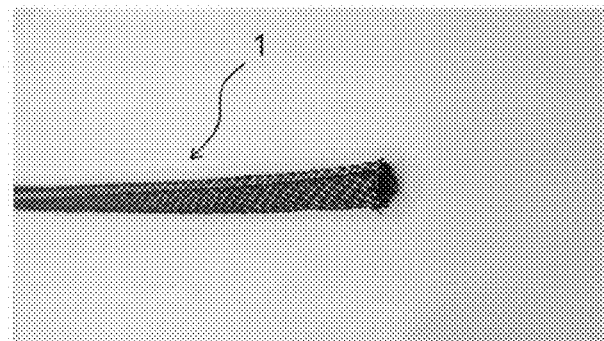
FIG. 1 is a captured image of a self-wrap tube of the related art to which a carbon fiber is applied.
Figure 2:
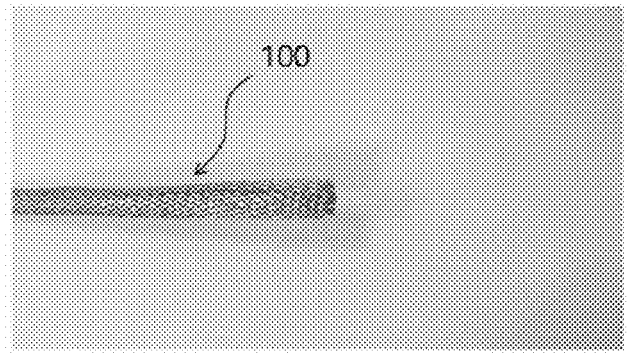
FIG. 2 is a captured image of a self-wrap electromagnetic wave shield tube according to the present disclosure to which a copper-clad aluminum (CCA) wire is applied.

FIG. 1 is a captured image of a self-wrap tube 1 of the related art to which a carbon fiber is applied. FIG. 2 is a captured image of a self-wrap electromagnetic wave shield tube according to the present disclosure to which a copper-clad aluminum (CCA) wire is applied.

A self-wrap tube refers to a tube that wraps itself in a circumferential direction due to self-wrapping characteristics thereof even when no external force is applied thereto and thus both ends thereof in the circumferential direction overlap each other at a predetermined angle to form overlapping parts. Therefore, a worker may separate the overlapping parts with a hand or another mechanism and insert a cable or the like into a gap between the overlapping parts, thereby completing installation of the cable and thus a fire or heat device, a fastening member, or the like is not necessary, thereby greatly improving workability of the installation of the cable at site.

In the self-wrap tube 1 of the related art illustrated in FIG. 1 to which a carbon fiber is applied, the carbon fiber is applied in a longitudinal direction and a shrinkable resin material fiber or wire is applied in a circumferential direction. Thus, when thermally contracted in a braided state, the self-wrap tube 1 rolls into a cylindrical shape and is provided in a self-wrapped form as illustrated in FIG. 1, so that it may be easily mounted on a cable or the like without using a torch or the like.

Although the carbon fiber is a non-metal, the carbon fiber provides a certain degree of shielding performance but does not provide sufficient shielding performance when used as a shielding material installed inside a vehicle.

In contrast, in the self-wrap electromagnetic wave shield tube 100 according to the present disclosure illustrated in FIG. 2, metal wires 11 are applied in a longitudinal direction and shrinkage members formed of a shrinkable resin material are applied in a circumferential direction to greatly improve workability of cable shielding work while providing sufficient shielding performance.

However, even when the metal wires are applied in the longitudinal direction, shielding quality, processability, etc. may greatly vary according to the type of metal, a diameter of the metal wires, or the number of metal wires constituting one bundle. A braid member and a self-wrap electromagnetic wave shield tube using the same according to the present disclosure will be described in detail below.

Figure 3:
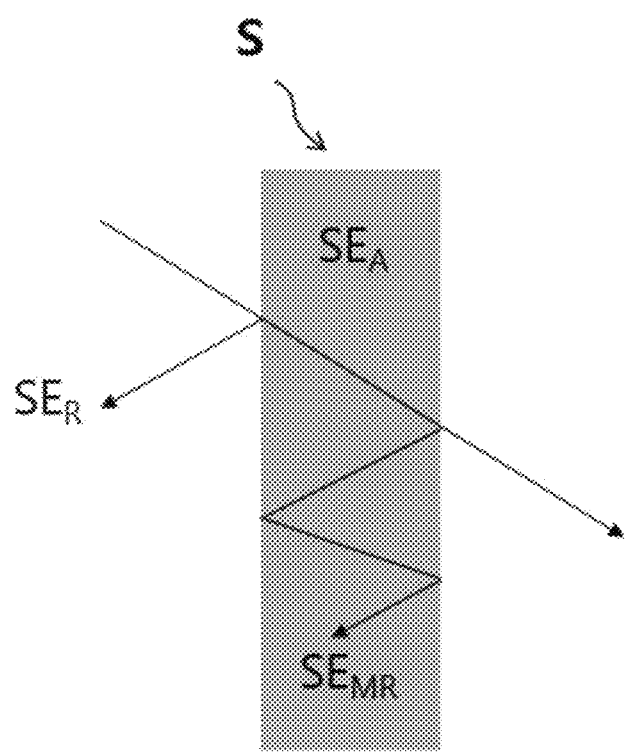
FIG. 3 is a conceptual diagram for explaining electromagnetic wave shielding characteristics of a shielding material.

FIG. 3 is a conceptual diagram for explaining electromagnetic wave shielding characteristics of a shielding material S.

In general, the principle of shielding electromagnetic waves using the shielding material S includes absorbing part of emitted electromagnetic waves by the shielding material S (SEA), reflecting part of the electromagnetic waves from a surface of the shielding material S (SER), or multiple-reflecting the remaining electromagnetic waves inside the shielding material S (SEMR) as illustrated in FIG. 3, thereby minimizing the intensity of the electromagnetic waves transmitted to the outside through the shielding material S.

In addition, whether the electromagnetic waves transmitted into the shielding material S quickly dissipate is related to a propagation length of the electromagnetic waves inside the shielding material S. A skin depth δ, which is a concept related to the propagation length of the electromagnetic waves inside the shielding material S, refers to a propagation length of the electromagnetic waves until the intensity of the electromagnetic waves introduced into the shielding material S attenuates to 1/e, and is known as Equation 1 below.

$$\delta = \sqrt{\frac{2}{\mu 0 * \omega * \sigma}}, \quad \text{[Equation 1]}$$

wherein μ0=permeability in a free space, ω=frequency of electromagnetic waves, and σ=electrical conductivity of the shielding material S High electromagnetic shielding performance of the shielding material S should be understood to mean that the skin depth δ expressed in Equation 1 above is small.

Therefore, it can be seen that the shielding material S having a small skin depth δ should be used to increase the electromagnetic shielding performance of the shielding material and a material having high electrical conductivity, i.e., a metal material, should be used to reduce the skin depth S according to Equation 1.

Therefore, it is preferable to apply a metal material as the shielding material S to a shielding member and a self-wrap electromagnetic wave shield tube using the same.

In general, copper is a material having high electrical conductivity with a specific resistance of $1.72 \times 10^{-8}$ Ωm. However, although pure copper has high electrical conductivity, the weight and costs thereof are extremely high and thus copper is not suitable as a shielding member and a self-wrap electromagnetic wave shield tube using the same.

In addition, pure aluminum is light and inexpensive as a shielding material but has relatively low electrical conductivity with a specific resistance of $2.74 \times 10^{-8}$ Ωm and thus shielding performance thereof is very lower that of copper.

Therefore, a CCA wire is applied as a shielding material of a shielding member and a self-wrap electromagnetic wave shield tube using the same according to the present disclosure.

The CCA wire is manufactured by covering an outer side of an aluminum wire with a copper layer and welding the resultant structure to form a copper clad layer and performing a process such as drawing on the copper clad layer to form a wire having a desired outer diameter, and includes an inner aluminum core and the copper clad layer outside the aluminum core and thus has the advantages of both copper and aluminum. A method of manufacturing the CCA wire is not limited to the above method, and various processes such as plating may be considered but welding and drawing are preferably applied to uniformly form the copper clad layer.

In the CCA wire, the properties of copper or aluminum may be reinforced by a ratio, e.g., a volume ratio, between copper and aluminum, but it is necessary to determine a copper volume fraction of the CCA wire according to a diameter of the wire, electrical conductivity required for a single wire, the weldability of the copper clad layer, etc. as will be described below.

The aluminum wire is preferably formed of aluminum with a purity of 99% or more, e.g., 1000 series aluminum, in terms of electrical conductivity, and the copper clad layer is preferably formed of oxygen-free copper with a purity of 99.9% or more.

A range of the copper volume fraction of the CCA wire will be described in detail below.

Figure 4:
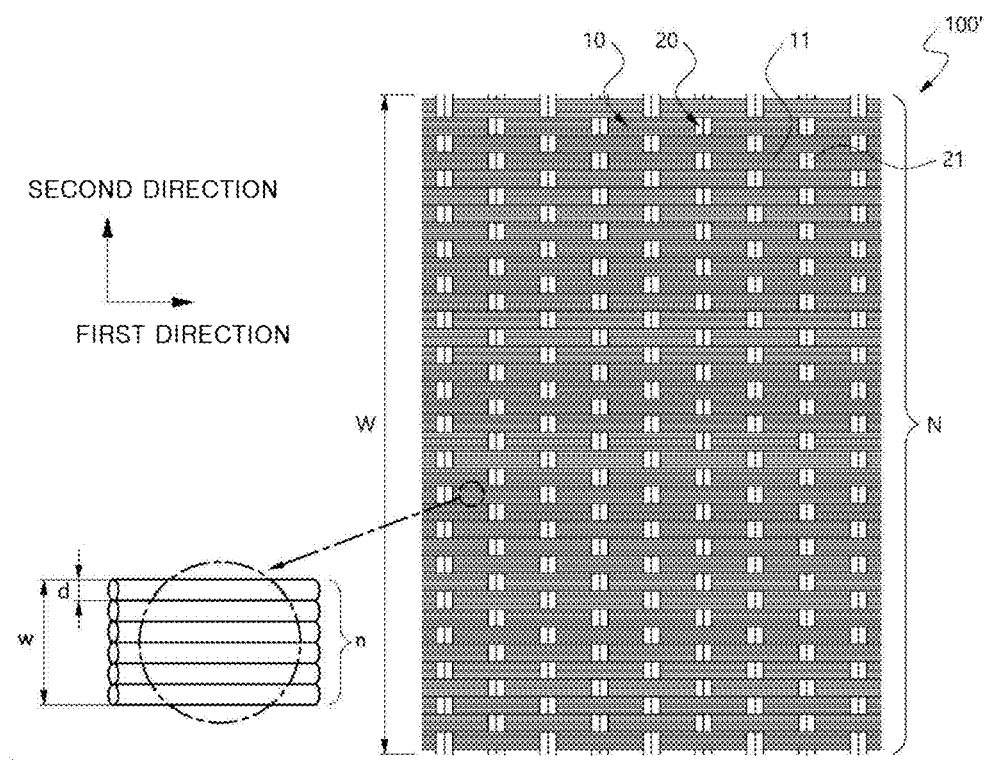
FIG. 4 illustrates a plan view and an enlarged view of a braid member according to the present disclosure.
Figure 5:
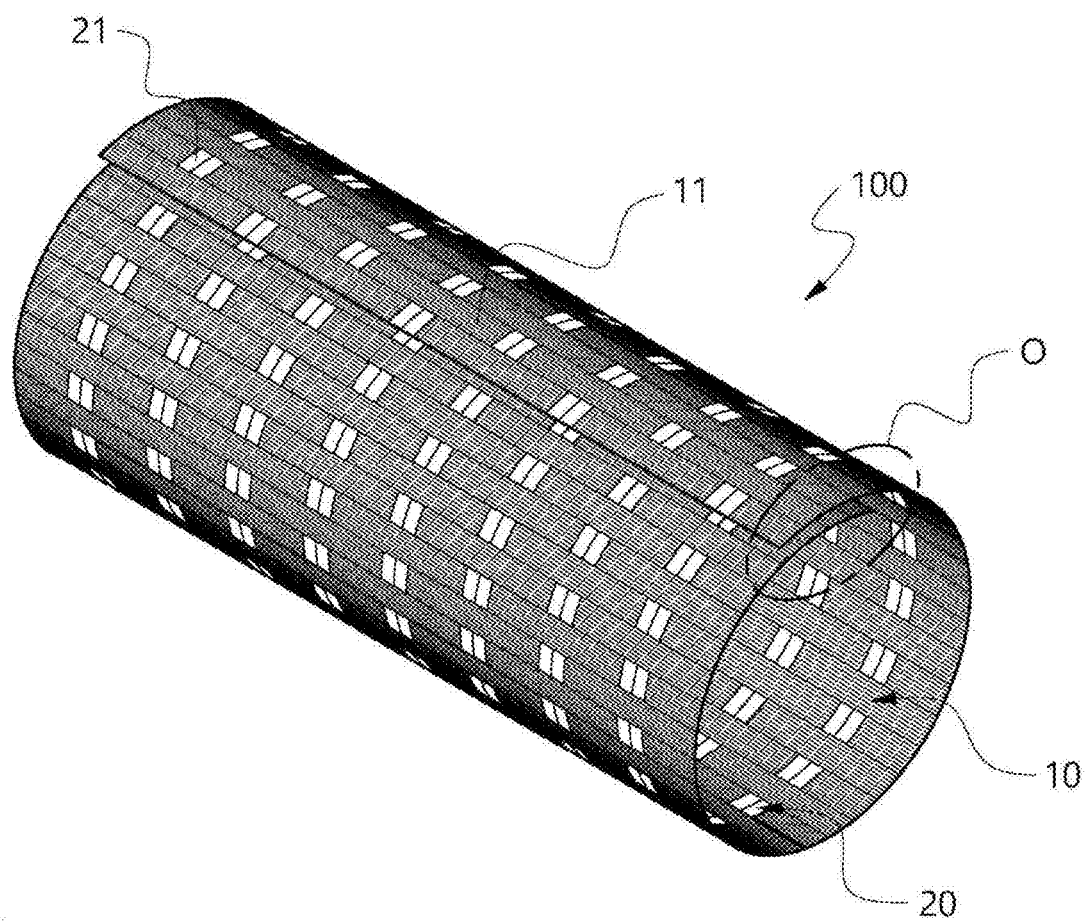
FIG. 5 is a perspective view of a self-wrap electromagnetic wave shield tube according to the present disclosure.
Figure 6:
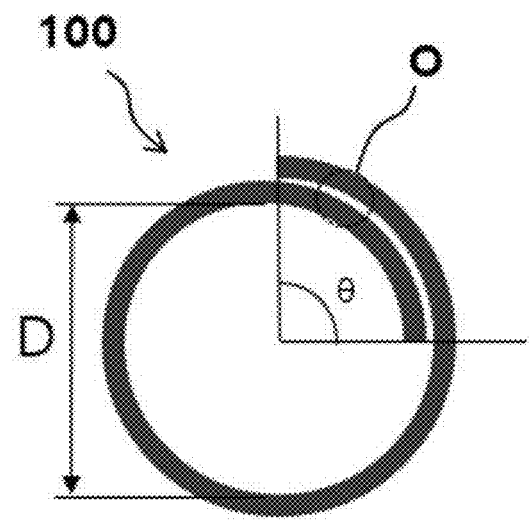
FIG. 6 is a cross-sectional view of a self-wrap electromagnetic wave shield tube according to the present disclosure.

FIG. 4 illustrates a plan view and an enlarged view of a braid member 100' according to the present disclosure. FIG. 5 is a perspective view of a self-wrap electromagnetic wave shield tube 100 according to the present disclosure. FIG. 6 is a cross-sectional view of the self-wrap electromagnetic wave shield tube 100 according to the present disclosure.

The self-wrap electromagnetic wave shield tube 100 according to the present disclosure may be manufactured by forming the braid member 100' of FIG. 4 by braiding and performing a thermal contraction process on the braid member 100' using a torch or the like to form overlapping parts O in a circumferential direction as illustrated in FIGS. 5 and 6.

The braid member 100' according to the present disclosure may be formed by braiding a plurality of wire bundles 10, which are arranged in a first direction and including metal wires 11 formed of a CCA material, and a plurality of contraction parts 20, which are arranged in a second direction perpendicular to the first direction and including a plurality of shrinkage members 20 having a thermal shrinkage property. The self-wrap electromagnetic wave shield tube 100 according to the present disclosure includes the braid member 100' formed by braiding the plurality of wire bundles 10 including the metal wires 11 of the CCA material and the plurality of shrinkage members 21 arranged perpendicular to the wire bundles 10 and having a heat shrinkage property. The wire bundles 10 of the braid member 100' are arranged in parallel in a longitudinal direction, the contraction parts 20 are arranged in a circumferential direction perpendicular to the longitudinal direction, the braid member 100' is thermally contracted into a cylindrical shape, and ends of the braid member 100' in a widthwise direction are overlapped in the circumferential direction to form overlapping parts.

Here, the term 'bundle' of wire bundles refers to a bundle or bunch of a plurality of wires, and the term 'part' of a contraction part refers to a set of shrinkage members including a plurality of shrinkage members. Thus, the number of wires constituting a bundle is greater than the number of shrinkage members of a contraction part.

The braid member 100' and the self-wrap electromagnetic wave shield tube 100 according to the present disclosure are manufactured in a braided structure and basically include metal wires 11 and shrinkage members 21. Because the metal wires 11 do not have a heat shrinkage property, the braid member 100' and the self-wrap electromagnetic wave shield tube 100 according to the present disclosure are manufactured using shrinkable fibers in a direction requiring shrinkage, as well as the metal wires 11, thereby taking advantages of the metal wires 11 and using the heat shrinkage property.

In the braid member 100' according to the present disclosure illustrated in FIG. 4, the wire bundles 10 arranged in the first direction and the contraction parts 20 arranged in a direction (the second direction) perpendicular to the first direction may be woven by braiding to form a braided structure.

A polyolefin-based wire may be used as an example of the shrinkage member 21.

The shrinkage member 21 has a diameter of 0.25 mm to 0.3 mm, and although FIGS. 4 and 5 illustrate that two shrinkage members 21 form one contraction part 20, the number of shrinkage members 21 may be increased or decreased.

Similarly, the contraction parts 20 are disposed in parallel to be apart from each other in the direction perpendicular to the wire bundles 10, and the shrinkage members 21 of each contraction part 20 may be also disposed in parallel to be apart from each other in the direction perpendicular to the wire bundles 10.

An average number of shrinkage members 21 arranged per inch in the longitudinal direction of the braid member 100' or the self-wrap electromagnetic wave shield tube 100 is preferably 17 to 41.

That is, under a condition that the average number of shrinkage members per inch is 17 to 41, a shielding factor is good, i.e., about 40 dB, at a signal frequency of 100 MHz, but the shielding factor of 40 dB is not satisfied when the number of shrinkage members per inch is less than 17 or greater than 41 and thus the shrinkage members are inappropriate as shrinkage members.

This is because when the average number of shrinkage members per inch is less than 17, an empty space between CCA wire bundles and the shrink members is large, thus reducing a shielding effect, and when the average number of shrinkage members per inch is greater than 41, CCA wires of CCA wire bundles cannot be sufficiently dispersed in the circumferential direction due to interference by the shrinkage members, thus reducing the shielding effect.

Polyolefin may be used as an example of a material of shrinkage members. Polyolefin, which is a type of synthetic resin, refers to an organic material prepared by addition polymerization reaction of olefins such as ethylene and propylene (hydrocarbons containing one double bond per molecule).

Examples of polyolefin, which may be used as a material of shrinkage members, include polyethylene, e.g., high-density polyethylene (HDPE), low-density polyethylene (LDPE), linear low-density polyethylene (LLDPE), ethylene-vinylacetate copolymer (EVA), of ultra-high molecular weight PE (UHMWPE), and may further include various types of polypropylene (PP), ethylene-propylene rubber (EPR), ethylene-propylene-diene monomer (EPDM), polyolefin elastomer (POE), ethylene/octene-1, etc.

Generally, polyolefin shrinkage members have elasticity, are insoluble in most organic solvents, are resistant to acids and bases, have an electrical insulation property, and are widely used as a material of general heat-shrinkable tubes.

The contraction parts 20 are each configured with a plurality of shrinkage members 21 formed of such a polyolefin material and are arranged perpendicular to a direction in which the wire bundles 10 are arranged.

The self-wrap electromagnetic wave shield tube 100 may be configured by heating the braid member 100' of FIG. 4 with a hot air blower or the like to form overlapping parts as illustrated in FIG. 5.

The self-wrap electromagnetic wave shield tube 100 including a shielding member according to the present disclosure may be used to protect a cable for use in a vehicle or the like and shield electromagnetic waves.

Therefore, an inner diameter D of the self-wrap electromagnetic wave shield tube 100 may be less than 10 mm in a wrapped state to correspond to a diameter of a cable for use in a vehicle. When the inner diameter D of the self-wrap electromagnetic wave shield tube 100 is 10 mm or less, a diameter of the metal wires 11 of the wire bundle 10 is 0.15 mm or less. The number of CCA metal wires of the wire bundle 10 may be determined such that a width of the wire bundle 10 in which the metal wires 11 are disposed in a single layer is 0.3 mm to 1.0 mm. For example, the number of CCA metal wires 11 may be set to ten or less.

Regarding the reason why the width of the wire bundles 10 is set to 0.3 mm to 1 mm, it was confirmed that when the width of the wire bundles 10 including the metal wires 11 of the CCA material was less than 0.3 mm, an extremely large number of wire bundles 10 should be used to meet a minimum width of a product at a braiding stage, thus reducing productivity and production efficiency, and a complete product may be bent when one wire bundle 10 heat-shrunk and thus warped.

When the width of the wire bundles 10 is greater than 1 mm, the metal wires 11 of each of the wire bundles 10 cannot be arranged in a single layer and thus overlap each other during a thermal contraction process after weaving. Therefore, the width of the wire bundles 10 decreases and thus a deviation between a total width of the braid members 100' and a total length of the circumference of the self-wrap electromagnetic wave shield tube 100 increases, thus making it difficult to design a product.

Therefore, when the diameter of each CCA wire is 0.15 mm or less, the width of the wire bundle 10 is preferably in a range of 0.3 mm to 1 mm.

When a self-wrap electromagnetic wave shield tube is configured by thermally contracting a braid member according to the present disclosure, a cross section thereof has a round shape due to the contraction of the contraction parts 20 and the overlapping parts O of the braid member which overlap each other in a radial direction are formed as illustrated in FIG. 6 although the self-wrap electromagnetic wave shield tube is formed in a tubular shape.

An outer diameter of a cable to be inserted in the self-wrap electromagnetic wave shield tube 100 is preferably greater than the inner diameter D of the self-wrap electromagnetic wave shield tube 100 to prevent movement of the cable or the self-wrap electromagnetic wave shield tube 100 during the inserting of the cable. However, the overlapping parts O are preferably maintained to cover all regions of the cable even in a state in which the cable is inserted. Accordingly, it is necessary to select a self-wrap electromagnetic wave shield tube 100 having an appropriate inner diameter according to the outer diameter of the cable.

An overlapping angle of the self-wrap electromagnetic wave shield tube 100 illustrated in FIGS. 5 and 6 in the circumferential direction is preferably 20 to 50 degrees in a state in which no cable is inserted therein to prevent the self-wrap electromagnetic wave shield tube 100 from being unrolled while an object to be shielded is inserted therein and to prevent unnecessary waste of materials.

As a concrete example, when a diameter of each wire is 0.12 mm, each wire bundle 10 includes six wires, a width of each wire bundle 10 is 0.72 mm, and overlapping parts formed in a size of about 45 degrees, 56 wire bundles 10 are used to manufacture the self-wrap electromagnetic wave shield tube 100 to have a diameter of 8 mm and 36 wire bundles 10 may be used to manufacture the self-wrap electromagnetic wave shield tube 100 to have a diameter of 4 mm.

A copper volume fraction of a CCA wire for maximizing electromagnetic shielding performance in a braid member woven with the wire bundles 10 of the CCA material and the contraction parts 20 and a self-wrap electromagnetic wave shield tube will be described below.

F1 which is a resistance value for 1 mm width of the self-wrap electromagnetic wave shield tube 100 of FIG. 5 in the circumferential direction may be simplified by Equation 2 below.

$$F1 = (\text{number } N \text{ of CCA wire bundles } 10 \times \text{number } n \text{ of wires of each CCA wire bundle } 10 \times \text{resistivity } (\Omega m) \text{ of each CCA wire})/\text{width } W \text{ (mm) of braid member)} \quad \text{[Equation 2]}$$

It may be assumed that F1 in Equation 2 is a resistance value when a width of the self-wrap electromagnetic wave shield tube 100 in the circumferential direction is 1 mm, and when a volume fraction of a copper clad layer of each CCA wire is changed, the resistance value F1 may also change and the shielding performance of the self-wrap electromagnetic wave shield tube 100 may depend on the resistance value F1.

Table 1 below shows a variation in the resistance value F1 in Equation 1 above when a copper volume fraction of a CCA wire is 5 vol %, 6 vol %, 7 vol %, 8 vol %, 9 vol %, 10 vol %, 25 vol %, or 100 vol % according to an internal diameter and the number of wire bundles.

In the case of the self-wrap electromagnetic wave shield tube 100 applied to a cable for use in a vehicle, it may be assumed that the shielding performance thereof is sufficient when a shielding factor (dB) is 50 dB or more at a signal frequency of 1 to 10 MHz, in consideration of a safety factor. In this case, it was confirmed that a reference value of the resistance value F1 was about 0.3Ω.

As shown in Table 1 below, when the copper volume fraction of the CCA wire is less than 10 vol % (e.g., 5 vol %, 6 vol %, 7 vol %, 8 vol %, or 9 vol %), the resistance value F1 is 0.3Ω or more according to an inner diameter of the self-wrap electromagnetic wave shield tube 100 or the like. Thus, it is expected that the shielding factor (dB) will be 50 dB or less at a signal frequency of 1 to 10 MHz, thereby preventing a shielding factor dB from being stably secured, and thus, the shielding performance of the self-wrap electromagnetic wave shield tube 100 is not sufficient.

The shielding performance is satisfactory when the copper volume fraction of the CCA wire is 10 vol % or more, but when the copper volume fracture is greater than 25 vol %, it should be understood that an extremely large amount of copper is used and costs and weight significantly increase when used as a shielding material of a cable for use in a vehicle with a high usage rate.

TABLE 1

| inner di- ameter (D, mm) | number n of wires/ bundle | number N of bundles | width W of braid member | number N of bundles/ width W (mm) | F1 (Ω) when copper volume fraction is 5 vol % | F1 (Ω) when copper volume fraction is 6 vol % | F1 (Ω) when copper volume fraction is 7 vol % | F1 (Ω) when copper volume fraction is 8 vol % | F1 (Ω) when copper volume fraction is 9 vol % | F1 (Ω) when copper volume fraction is 10 vol % | F1 (Ω) when copper volume fraction is 25 vol % | F1 (Ω) when copper volume fraction is 100 vol % |
|---|---|---|---|---|---|---|---|---|---|---|---|---|
| 4 | 6 | 36 | 28 | 1.3 | 0.305 | 0.303 | 0.302 | 0.300 | 0.298 | 0.297 | 0.274 | 0.198 |
| 5 | 6 | 40 | 31 | 1.3 | 0.304 | 0.302 | 0.301 | 0.299 | 0.297 | 0.296 | 0.273 | 0.197 |
| 6 | 6 | 46 | 35 | 1.3 | 0.307 | 0.305 | 0.304 | 0.302 | 0.300 | 0.298 | 0.275 | 0.199 |
| 8 | 6 | 56 | 42 | 1.3 | 0.305 | 0.303 | 0.301 | 0.300 | 0.298 | 0.296 | 0.273 | 0.197 |

Therefore, when the self-wrap electromagnetic wave shield tube 100 is configured by applying the CCA wires according to the above result, a copper volume fraction of the CCA wires of the wire bundles 10 may be 10 vol % or more and preferably 10 vol % to 25 vol % or less regardless of the inner diameter of the self-wrap electromagnetic wave shield tube 100, the width of the braid member 100', etc.

Figure 7:
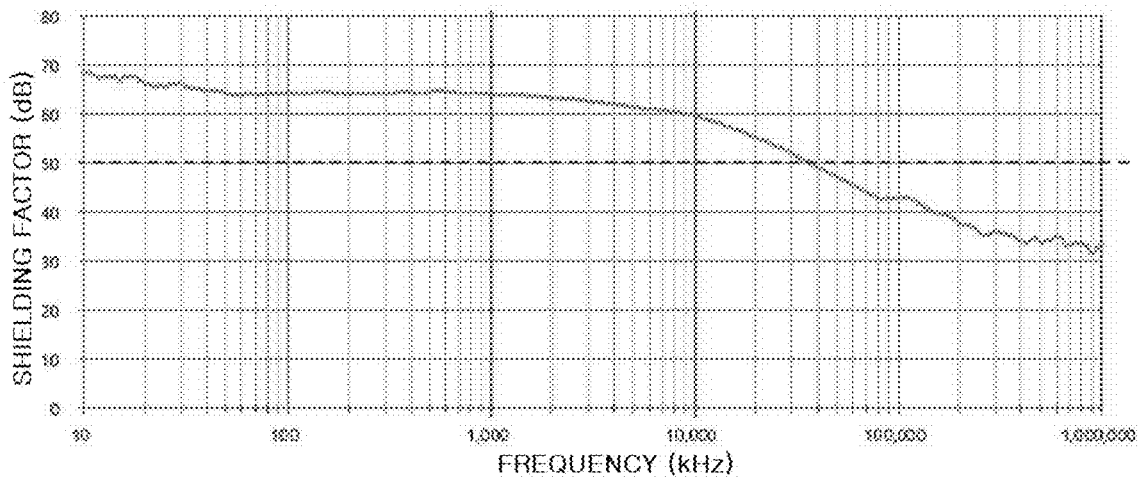
FIG. 7 illustrates a result of an electromagnetic wave shielding test conducted on a self-wrap electromagnetic wave shield tube according to the present disclosure to which a CCA wire with a copper volume fraction of 15 vol % is applied.

FIG. 7 illustrates a result of an electromagnetic wave shielding test conducted on a self-wrap electromagnetic wave shield tube according to the present disclosure to which a CCA wire in which a volume ratio of copper to aluminum is 15 vol % is applied.

As illustrated in FIG. 7, in the self-wrap electromagnetic wave shield tube 100 according to the present disclosure to which a wire of a CCA material in which a volume ratio of copper to aluminum is 15 vol % is applied, a shielding factor of 50 dB or more, which is higher than a shielding factor of 40 dB required generally for electrical components in vehicles, can be secured at a signal frequency of 1 to 10 MHz, in consideration of a safety factor.

In addition, in the self-wrap electromagnetic wave shield tube 100, a shielding factor of 50 dB or more can be secured at a signal frequency of 1 MHz to 10 MHz even when a safety factor is considered, and furthermore, a shielding factor of 40 dB required for general vehicle components can be secured even at a high signal frequency of 100 MHz (100,000 KHz).

While the present disclosure has been described above with respect to exemplary embodiments thereof, it would be understood by those of ordinary skilled in the art that various changes and modifications may be made without departing from the technical conception and scope of the present disclosure defined in the following claims. Thus, it is clear that all modifications are included in the technical scope of the present disclosure as long as they include the components as claimed in the claims of the present disclosure.

What is claimed is:

1. A self-wrap electromagnetic wave shield tube comprising a braid member formed by braiding a plurality of wire bundles including metal wires formed of copper-clad aluminum (CCA) and a plurality of shrinkage members arranged perpendicular to the wire bundles and having a heat shrinkage property,
   wherein the wire bundles of the braid member are arranged in parallel in a longitudinal direction,
   the shrinkage members are arranged in a circumferential direction perpendicular to the longitudinal direction, and
   the braid member is thermally contracted into a cylindrical shape and comprises overlapping parts overlapping in the circumferential direction,
   wherein a plurality of shrinkage members are arranged adjacent to each other to form one contraction part, and a plurality of contraction parts are arranged apart from each other in the longitudinal direction of the self-wrap electromagnetic wave shield tube.

2. The self-wrap electromagnetic wave shield tube of claim 1, wherein a copper volume fraction of the metal wires of the CCA material, which constitute the wire bundles, is in a range of 10 vol % to 25 vol %.

3. The self-wrap electromagnetic wave shield tube of claim 2, wherein a shielding factor is 50 dB or more at a signal frequency of 1 MHz to 10 MHz.

4. The self-wrap electromagnetic wave shield tube of claim 3, wherein a resistance value (F1) for 1 mm width of the self-wrap electromagnetic wave shield tube in the circumferential direction is less than 0.3Ω and is defined by the following equation:

$$F1 = (\text{number } N \text{ of CCA wire bundles} \times \text{number } n \text{ of wires of each CCA wire bundle} \times \text{resistivity } (\Omega m) \text{ of each CCA wire}) / \text{width } W \text{ (mm) of braid member}).$$

5. The self-wrap electromagnetic wave shield tube of claim 2, wherein the self-wrap electromagnetic wave shield tube has an inner diameter of 10 mm or less, and
   each of the wire bundles of the braid member has a width of 0.3 mm to 1 mm.

6. The self-wrap electromagnetic wave shield tube of claim 5, wherein the metal wires of the wire bundles have a diameter of 0.15 mm or less, and
   the wire bundles comprises ten or less metal wires.

7. The self-wrap electromagnetic wave shield tube of claim 1, wherein an overlapping range of the overlapping parts in the circumferential direction is a range of 20 to 50 degrees in a state of a cable is not inserted into the self-wrap electromagnetic wave shield tube.

8. The self-wrap electromagnetic wave shield tube of claim 1, wherein the metal wires of the CCA material comprise:
   aluminum wires; and
   a copper clad layer surrounding outer sides of the aluminum wires.

9. The self-wrap electromagnetic wave shield tube of claim 8, wherein the aluminum wires are formed of aluminum with a purity of 99% or more, and
   the copper clad layer is formed of oxygen-free copper with a purity of 99.9% or more.

10. The self-wrap electromagnetic wave shield tube of claim 1, wherein the shrinkage members comprise wires of a polyolefin-based resin material.

11. The self-wrap electromagnetic wave shield tube of claim 10, wherein an average number of shrinkage members per inch in the longitudinal direction of the self-wrap electromagnetic wave shield tube is seventeen to forty one.

12. The self-wrap electromagnetic wave shield tube of claim 11, wherein a shielding factor is 40 dB or more at a signal frequency of 100 MHz.

13. The self-wrap electromagnetic wave shield tube of claim 12, wherein the shrinkage members have a diameter of 0.25 mm to 0.3 mm.

14. The self-wrap electromagnetic wave shield tube of claim 13, wherein the plurality of shrinkage members of the contraction part are arranged in parallel in a direction perpendicular to the longitudinal direction of the self-wrap electromagnetic wave shield tube.

15. The self-wrap electromagnetic wave shield tube of claim 14, wherein two shrinkage members form one contraction part.

16. The self-wrap electromagnetic wave shield tube of claim 1, wherein the metal wires of the wire bundles are arranged in a single layer.

17. A braid member which is formed by braiding a plurality of wire bundles including metal wires formed of a copper clad aluminum (CCA) material and a plurality of shrinkage members arranged perpendicular to the wire bundles and having a heat shrinkage property,
   wherein a plurality of shrinkage members are arranged adjacent to each other to form one contraction part, and
   a plurality of contraction parts are arranged apart from each other in the longitudinal direction of the self-wrap electromagnetic wave shield tube.

18. The braid member of claim 17, wherein a copper volume fraction of the metal wires of the CCA material, which constitute the wire bundles, is 10 vol % to 25 vol %, and
   the metal wires of the CCA material comprise:
   aluminum wires; and
   a copper clad layer surrounding outer sides of the aluminum wires.

19. The braid member of claim 18, wherein an average number of shrinkage members per inch in a longitudinal direction of the wire bundles is seventeen to forty one.

* * * * *